United States Patent [19]
Ueda

[11] Patent Number: 5,172,012
[45] Date of Patent: Dec. 15, 1992

[54] POWER-ON CLEARING CIRCUIT IN SEMICONDUCTOR IC

[75] Inventor: Chiharu Ueda, Tokyo, Japan

[73] Assignee: Seiko Instruments Inc., Japan

[21] Appl. No.: 717,410

[22] Filed: Jun. 18, 1991

[30] Foreign Application Priority Data

Jun. 20, 1990 [JP] Japan .................. 2-163521

[51] Int. Cl.[5] .................. H03K 17/22
[52] U.S. Cl. .................. 307/272.3; 307/594; 307/597; 307/296.5
[58] Field of Search .................. 307/272.3, 594, 597, 307/296.5, 273

[56] References Cited

U.S. PATENT DOCUMENTS

| | | | |
|---|---|---|---|
| 4,633,107 | 12/1986 | Norsworthy | 307/296.5 |
| 4,818,904 | 4/1989 | Kabayashi | 307/296.5 |
| 4,873,458 | 10/1989 | Yoshida | 307/362 |
| 4,902,907 | 2/1990 | Haga et al. | 307/272.3 |
| 4,922,133 | 5/1990 | Iwahashi et al. | 307/361 |
| 5,008,566 | 4/1991 | Hashimoto | 307/296.8 |
| 5,030,845 | 7/1991 | Lowe et al. | 307/296.5 |
| 5,039,875 | 8/1991 | Chang | 307/272.3 |

Primary Examiner—Janice A. Howell
Assistant Examiner—Scott A. Ouellette
Attorney, Agent, or Firm—Bruce L. Adams; Van C. Wilks

[57] ABSTRACT

The pulse generator is provided in a semiconductor integrated circuit device, in the form of a power-on clearing circuit. The generator is comprised of a capacitor chargeable to produce a power-on clearing pulse, a current-flow regulating element for regulatively charging the capacitor to output a state signal, and a voltage detector operative in an active condition for monitoring a level of a rising power source voltage to control the current-flow regulating element and being responsive to the state signal to switch to a rest condition. By such construction, a power-on clearing pulse is stably generated regardless of a rising rate of the power source voltage while eliminating a current consumption after completion of the generation of the power-on clearing pulse.

20 Claims, 1 Drawing Sheet

POWER-ON CLEARING CIRCUIT IN SEMICONDUCTOR IC

BACKGROUND OF THE INVENTION

The present invention generally relates to a semiconductor integrated circuit device, and specifically relates to power-on clearing circuit integrated in the semiconductor device for generating a reset or clearing pulse effective to clear the device at the time of power on.

As shown in FIG. 2, the conventional power-on clearing circuit provided in a semiconductor integrated circuit device is comprised of a capacitor 1 and a current-flow regulating element 2.

The FIG. 2 power-on clearing circuit can effectively generate a reset pulse or initializing pulse when a rising rate of a power source voltage at the time of power-on is sufficiently greater than a charging rate of the capacitor 1. However, as shown in FIG. 3, when the rising rate of the power source voltage is smaller than the charging rate of the capacitor 1, the capacitor 1 can be fully charged during the rising period of the power source voltage, thereby causing a drawback that the power-on clearing circuit fails to generate a reset pulse.

There is another conventional method employing a power source voltage detecting circuit operative to generate an output signal to be used as a system clear pulse. However, such a circuit may inadvertently generate an output pulse when a varying power source voltage falls below a given reference voltage, thereby disturbing normal operation of a system utilizing such a circuit. Further, the power source voltage detecting circuit must be regularly powered to continuously monitor the power source voltage, thereby causing a drawback that a useless electric current is consumed in the detecting circuit.

SUMMARY OF THE INVENTION

In view of the above noted drawbacks of the prior art, an object of the present invention is to ensure generation of a clearing pulse even if the power source voltage rises gradually, while eliminating electric current consumption of a power-on clearing circuit after completion of the clearing operation.

In order to achieve the aforesaid object, the inventive power-on clearing circuit is comprised of a capacitor, a current-flow regulating means for regulatively charging the capacitor, a latching means for latching or holding a charged state of the capacitor to produce a state signal, and a voltage detecting means switchable between an active or operative condition and a rest condition in response to the state signal for detecting a level of a power source voltage to control the current-flow regulating means. By such construction, if the power source voltage rises gradually, the charging of the capacitor is temporarily suspended during a period in which the power source voltage remains in a low level so as to ensure generation of a clearing pulse. Once the clearing pulse has been generated, the voltage detecting means is switched to the rest condition so as to eliminate useless electric current consumption.

In operation of the inventive power-on clearing circuit provided in a semiconductor integrated circuit device, in case that the power source voltage rises sharply or rapidly, a potential level at a junction point between the capacitor and the current-flow regulating means substantially follows a potential level of a power source terminal connected to the capacitor to thereby instantly trigger a clearing pulse. Then, the capacitor is progressively charged to finish outputting of the clearing pulse. On the other hand, in case that the power source voltage rises gradually, the voltage detecting means detects an initial condition that the power source voltage remains at a relatively low level and accordingly controls the current-flow regulating means to cut off a charging current of the capacitor so as to enable generation of a desired clearing pulse. Then, when the power source voltage reaches a high level, the voltage detecting means detects that condition to turn on the current-flow regulating means to flow a charging current to charge the capacitor to thereby finish outputting of the clearing pulse. Concurrently, the voltage detecting means is switched to the rest condition to break a current flow path thereof. Meanwhile, the latching means operates to latch the charged state of the capacitor to complete the clearing operation.

DETAILED DESCRIPTION OF THE INVENTION

Figure 1:
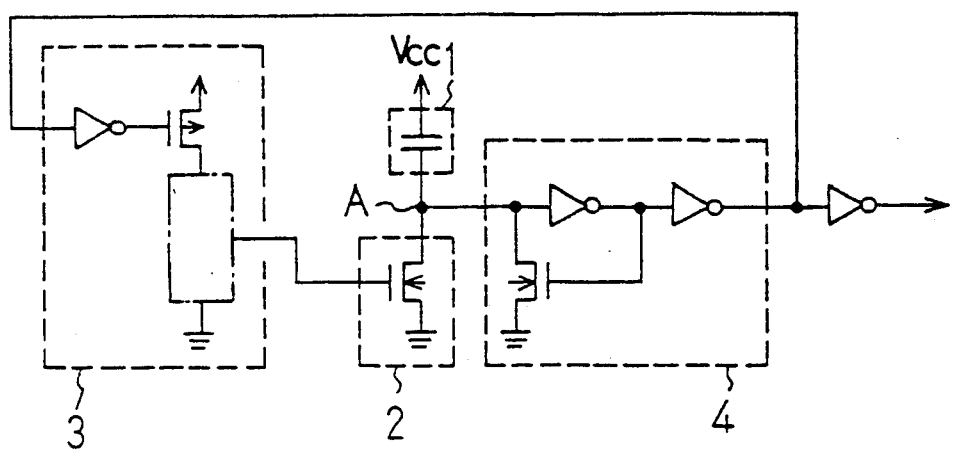
FIG. 1 is a circuit diagram showing a first embodiment of the inventive power-on clearing circuit in a semiconductor integrated circuit device.
Figure 2:
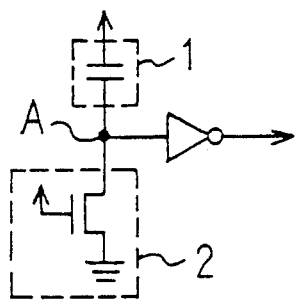
FIG. 2 is a circuit diagram showing the conventional power-on clearing circuit in a semiconductor integrated circuit device.
Figure 3:
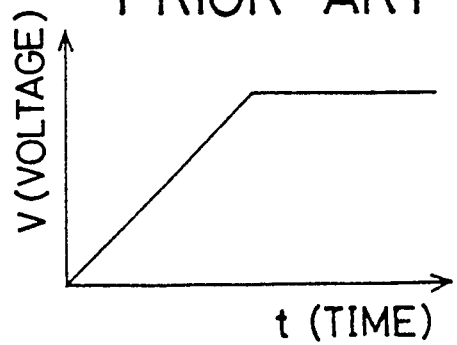
FIG. 3 is a timing chart of the conventional power-on clearing circuit in a semiconductor integrated circuit device.

Hereinafter, embodiments of the inventive circuit will be described in detail with reference to the drawings. FIG. 1 is a circuit diagram of a first embodiment incorporated into a typical semiconductor integrated circuit device (not shown). In the FIG. 1 circuit, a capacitor 1 is connected at its one electrode to a Vcc line of a power source, and is connected at its other electrode to an output terminal of a current-flow regulating means 2 as well as to an input terminal of a latching means 4. A voltage detecting means 3 is connected at its output terminal to an input terminal of the current-flow regulating means 2. The voltage detecting means 3 is arranged between terminals of the power source to detect a power source voltage, and includes a switching transistor connected at its input terminal to an output terminal of the latching means 4 through a feedback signal line to receive a state or status signal indicative of a charged state of the capacitor 1 to thereby switch the voltage detecting means 3 between an active condition and a rest condition in response to the state signal.

In operation, firstly in case that the power source voltage rises rapidly at the time of power-on, the charging rate of the capacitor 1 cannot exceed the rapid rising rate of the power source voltage even if the current-flow regulating means 2 is placed in a conductive state effective to flow a charging current to the capacitor 1. Therefore, the potential level at a junction point A between the capacitor 1 and the current-flow regulating means 2 substantially follows the potential level of the power source terminal connected to the other electrode of the capacitor 1. At this moment, the potential level of the junction point A is indicative of a noncharging state and is judged to be a logic level L representative of the potential level of the power source terminal connected to the other electrode of the capacitor 1, thereby enabling generation of a desired clearing pulse through an output inverter. At this stage, the latching means 4 feeds back a state signal indicative of the noncharging state of the capacitor 1 so that the voltage detecting means 3 is placed in the active condition and outputs a control signal to control the current-flow regulating means 2 to effect charging of the capacitor 1. Consequently, the capacitor 1 is progressively charged to exceed a certain level such that the potential level of the junction point A is logically turned to another level H opposite to the potential level of the power source terminal connected to the other electrode of the capacitor 1, indicative of the charged state of the capacitor 1.

When the capacitor 1 is turned to the charged state, the latching means 4 electrically latches this charged state of the capacitor 1 to finish generation of the clearing pulse through the output inverter. At this moment, the voltage detecting means 3 receives a state or status signal indicative of the charged state of the capacitor 1 from the output terminal of the latching means 4 to switch to the rest condition to thereby save the current consumption of the voltage detecting means 3. By such operation, there has been generated a desired power-on clearing pulse having a certain pulse duration determined by a time constant of the capacitor 1 and current-flow regulating means 2.

Next, in case that the power source voltage rises gradually at relatively low rate when turning a power switch on, the voltage detecting means 3 detects initially that the power source voltage stays at a relatively low level during an early stage of the rising period, and produces an output signal to accordingly control the current-flow regulating means 2 to suspend charging of the capacitor 1. Consequently, the potential level of the junction point A follows the potential level of the power source terminal connected to the other electrode of the capacitor 1 to indicate the noncharged state of the capacitor 1. At this moment, the latching means 4 outputs a state signal indicative of the noncharged state so as to generate a desired clearing pulse through the output inverter and so as to hold the voltage detecting means 3 in the active condition to continue monitoring of the power source voltage.

Then, the power source progressively rises so that the voltage detecting means 3 operates when the power source voltage exceeds a given reference voltage to control the current-flow regulating means to start charging of the capacitor 1. The capacitor 1 is progressively charged through the current-flow regulating means 2 so that the potential level of the junction point A approaches to a potential level of a power source terminal opposite to the before-mentioned power source terminal connected to the other electrode of the capacitor. Lastly, the potential level of the junction point A is logically inverted to indicate that the capacitor 1 has been charged. Thereafter, the latching means 4 latches the charged state of the capacitor 1 so as to switch the voltage detecting means 3 to the rest condition and so as to finish generation of the clearing pulse in manner similar to the case where the power source voltage rises rapidly or instantly.

Figure 4:
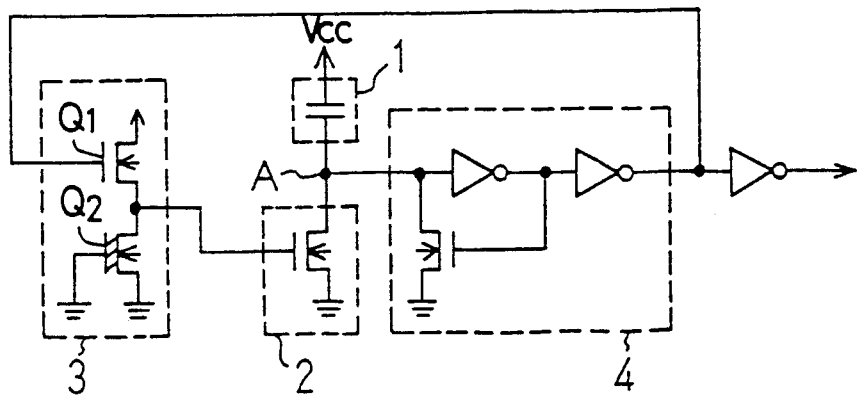
FIG. 4 is a circuit diagram showing a second embodiment of the inventive power-on clearing circuit in a semiconductor integrated circuit device.

FIG. 4 is a circuit diagram showing a second embodiment of the inventive power-on clearing circuit in a semiconductor integrated circuit device. In the FIG. 4 circuit, a voltage detecting means 3 is comprised of an NMOS transistor Q1 of the enhancement type and an NMOS transistor Q2 of the depletion type. The NMOS transistors Q1 and Q2 have suitably selected threshold voltage values and conductances such that the voltage detecting means 3 produces an output voltage of the GND level when the power source voltage is at a relatively low level in the active condition. On the other hand, when the power source voltage exceeds a given reference voltage, the output voltage of the detecting means 3 rises while the power source voltage rises. Accordingly, the voltage detecting means 3 operates when the power source voltage is at relatively low level to control a current-flow regulating means 2 to suspend charging of a capacitor 1, while the means 3 operates when the power source voltage rises above a certain degree to control the current-flow regulating means 2 to charge the capacitor 1 in a manner similar to the first embodiment. Further, when the capacitor 1 has been substantially charged up, the NMOS transistor Q1 receives a state signal outputted from a latching means 4 to turn off. Consequently, after completion of a clearing pulse generation, the voltage detecting means 3 is cut out from a current supply path.

As described above, according to the invention, a regular semiconductor integrated circuit device is provided with a power-on clearing circuit in the form of a one-shot pulse generator constructed such that a clearing pulse can be stably generated without regard to the rising rate of a power source voltage while suppressing electric current consumption, thereby advantageously improving overall reliability of the integrated circuit device system. Further, according to the invention, the clearing pulse generation is not affected by external noise or disturbance, thereby achieving safe performance of the semiconductor integrated circuit device.

What is claimed is:

1. A power-on clear circuit comprising:
   a capacitor having two electrodes with one electrode thereof coupled with a power source;
   current flow regulating means connected in series to the other electrode of the capacitor and operative when in a conductive state to flow a charging current to the capacitor;
   latching means connected to said other electrode of the capacitor to latch a charged state of the capacitor;
   voltage detecting circuit means for detecting a power source voltage applied thereto and for generating a control signal which controls the current flow regulating means; and
   switching means having conductive and non-conductive states and connected to the voltage detecting circuit means to apply the power source voltage to the voltage detecting circuit means when the switching means is in the conductive state.

2. A power-on clear circuit as claimed in claim 1; wherein the latching means applies a state signal indicative of the charged state of the capacitor to the switching means to place the switching mean in the non-conductive state.

3. A power-on clear circuit as claimed in claim 2; wherein the current flow regulating means comprises a MOS transistor having a gate, the gate of the MOS transistor being connected to an output terminal of the voltage detecting circuit means.

4. A power-on clear circuit as claimed in claim 1; wherein the current flow regulating means comprises a MOS transistor having a gate, the gate of the MOS transistor being connected to an output terminal of the voltage detecting circuit means.

5. A power-on clear circuit comprising:
a capacitor having two electrodes with one electrode thereof coupled with a power source;
current flow regulating means connected in series to the other electrode of the capacitor and operative when in a conductive state to flow a charging current to the capacitor;
latching means connected to the other electrode of the capacitor to latch a charged state of the capacitor; and
voltage detecting circuit means comprising two MOS transistors connected in series for detecting a power source voltage applied thereto and for generating a control signal which controls the current flow regulating means, one of the two transistors also acting as a switching circuit to reduce current consumption of the voltage detecting circuit means.

6. A power-on clear circuit as claimed in claim 5; wherein one of the two MOS transistors comprises a MOS transistor of the enhancement type which acts as the switching circuit and the other comprises a MOS transistor of the depletion type.

7. A power-on clear circuit as claimed in claim 6; wherein the latching means applies a state signal indicative of the charged state of the capacitor to a gate of the MOS transistor of the enchancement type to control a switching state thereof.

8. A power-on clear circuit as claimed in claim 7; wherein the current flow regulating means comprises a MOS transistor having a gate, the gate of the MOS transistor being connected to an output terminal of the voltage detecting circuit means.

9. A power-on clear circuit as claimed in claim 6; wherein the current flow regulating means comprises a MOS transistor having a gate, the gate of the MOS transistor being connected to an output terminal of the voltage detecting circuit means.

10. A power-on clear circuit as claimed in claim 5; wherein the current flow regulating means comprises a MOS transistor having a gate, the gate of the MOS transistor being connected to an output terminal of the voltage detecting circuit means.

11. A power-on clear circuit for producing a power-on clear signal, the circuit comprising: a chargeable capacitor having a pair of electrodes; means connecting one of the capacitor electrodes to a power source during use of the circuit; current flow regulating means connected in series with the other capacitor electrode and responsive to a control signal applied thereto for regulating the flow of charging current to the capacitor; means connected to said other capacitor electrode for producing a status signal indicative of a state of charge of the capacitor; means responsive to the status signal for producing a power-on clear signal; and voltage detecting means responsive to the status signal and operable in an active mode when the status signal indicates that the charged state of the capacitor is below a given level for detecting the voltage of the power source and producing a corresponding control signal which is applied to the current flow regulating means to accordingly control the flow of charging current by the current flow regulating means and operable in a rest mode when the status signal indicates that the charged state of the capacitor is above the given level for disconnecting the voltage detecting means from the power source to thereby converse current consumption of the voltage detecting means.

12. A power-on clear circuit according to claim 11; including latching means for latching the charged state of the capacitor when the state of charge thereof is above the given level.

13. A power-on clear circuit according to claim 12; wherein the latching means includes the means for producing a status signal.

14. A power-on clear circuit according to claim 12; wherein the current flow regulating means comprises a MOS transistor having a gate connected to receive the control signal.

15. A power-on clear circuit according to claim 11; wherein the voltage detecting mean includes switching means responsive t the status signal for switching the voltage detecting means between the active mode in which the voltage detecting mean sis connected to the power source and the rest mode in which the voltage detecting means is disconnected from the power source.

16. A power-on clear circuit according to claim 15, wherein the switching means comprises a MOS transistor having a gate connected to receive the status signal.

17. A power-on clear circuit according to claim 15; wherein the voltage detecting means comprises two MOS transistors connected in series, one of the transistors comprising said switching means.

18. A power-on clear circuit according to claim 17; wherein one of the two MOS transistors comprises an enhancement-type MOS transistor and the other comprises a depletion-type MOS transistor.

19. A power-on clear circuit according to claim 18; wherein the enhancement type MOS transistor constitutes the switching means.

20. A power-on clear circuit according to claim 15; wherein the current flow regulating means comprises a MOS transistor having a gate connected to receive the control signal.

* * * * *